United States Patent
Ng et al.

(10) Patent No.: US 9,323,877 B2
(45) Date of Patent: Apr. 26, 2016

(54) BEAM-STEERED WIDE BANDWIDTH ELECTROMAGNETIC BAND GAP ANTENNA

(71) Applicant: Raytheon Company, Waltham, MA (US)

(72) Inventors: Jackson Ng, Tucson, AZ (US); Charles G. Gilbert, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 200 days.

(21) Appl. No.: 14/077,409

(22) Filed: Nov. 12, 2013

(65) Prior Publication Data

US 2015/0130673 A1       May 14, 2015

(51) Int. Cl.
| | |
|---|---|
| *H01Q 15/02* | (2006.01) |
| *G06F 17/50* | (2006.01) |
| *H01Q 1/34* | (2006.01) |
| *H01Q 1/28* | (2006.01) |
| *H01Q 1/40* | (2006.01) |
| *H01Q 9/04* | (2006.01) |
| *H01Q 15/00* | (2006.01) |
| *H01Q 19/10* | (2006.01) |

(52) U.S. Cl.
CPC ............ *G06F 17/5068* (2013.01); *H01Q 1/286* (2013.01); *H01Q 1/34* (2013.01); *H01Q 1/40* (2013.01); *H01Q 9/0421* (2013.01); *H01Q 15/008* (2013.01); *H01Q 19/106* (2013.01)

(58) Field of Classification Search
CPC ......... H01Q 19/02; H01Q 1/288; H01Q 1/32; H01Q 1/34; H01Q 1/40; H01Q 9/0421
See application file for complete search history.

(56) References Cited

U.S. PATENT DOCUMENTS

| | | | | |
|---|---|---|---|---|
| 2,817,086 | A | * 12/1957 | Kelly et al. | ............... 343/895 |
| 4,063,248 | A |   12/1977 | Debski et al. | |
| 4,287,518 | A | *  9/1981 | Frosch et al. | ......... 343/700 MS |
| 4,427,984 | A |    1/1984 | Anderson | |
| 4,716,415 | A |   12/1987 | Kelly | |
| 5,264,860 | A |   11/1993 | Quan | |
| 5,361,049 | A |   11/1994 | Rubin et al. | |
| 5,506,589 | A |    4/1996 | Quan et al. | |
| 5,892,485 | A | *  4/1999 | Glabe et al. | ............... 343/789 |

(Continued)

FOREIGN PATENT DOCUMENTS

| | | |
|---|---|---|
| FR | 2 691 014 | 11/1993 |
| WO | WO 02/052674 A1 | 7/2002 |

OTHER PUBLICATIONS

Office Action dated Jan. 30, 2014, U.S. Appl. No. 13/457,547, filed Apr. 27, 2012, pp. 1-22.

(Continued)

*Primary Examiner* — Hoanganh Le
(74) *Attorney, Agent, or Firm* — Daly, Crowley, Mofford & Durkee, LLP (57) ABSTRACT

An antenna includes a radiating element that is held in a fixed orientation with respect to an underlying electromagnetic band gap (EBG) structure. In one embodiment, the radiating element and the EBG structure are both housed within a conductive cavity. The radiating element, the EBG structure, and the cavity are designed together to achieve an antenna having improved operational characteristics (e.g., enhanced bandwidth, beam steering, etc.). In some embodiments, the antenna may be implemented as a flush mounted or conformal antenna on an outer surface of a supporting platform.

23 Claims, 9 Drawing Sheets

(56) References Cited

U.S. PATENT DOCUMENTS

| | | | |
|---|---|---|---|
| 6,052,889 A | 4/2000 | Yu et al. | |
| 6,175,337 B1 | 1/2001 | Jasper, Jr. et al. | |
| 6,271,799 B1 | 8/2001 | Rief et al. | |
| 6,366,254 B1* | 4/2002 | Sievenpiper et al. | 343/770 |
| 6,433,756 B1* | 8/2002 | Sievenpiper et al. | 343/909 |
| 6,496,115 B2 | 12/2002 | Arakawa | |
| 6,518,930 B2 | 2/2003 | Itoh et al. | |
| 6,545,647 B1* | 4/2003 | Sievenpiper et al. | 343/795 |
| 6,670,921 B2* | 12/2003 | Sievenpiper et al. | 343/700 MS |
| 6,952,190 B2 | 10/2005 | Lynch et al. | |
| 7,145,518 B2* | 12/2006 | Tanaka et al. | 343/909 |
| 7,307,596 B1 | 12/2007 | West | |
| 7,522,105 B1 | 4/2009 | LaComb | |
| 7,855,689 B2* | 12/2010 | Fukui et al. | 343/731 |
| 7,884,778 B2 | 2/2011 | Wu et al. | |
| 2004/0233112 A1 | 11/2004 | Aisenbrey | |
| 2005/0068233 A1* | 3/2005 | Tanaka et al. | 343/700 MS |
| 2007/0224737 A1 | 9/2007 | Berlin et al. | |
| 2009/0295665 A1* | 12/2009 | Orton et al. | 343/793 |
| 2009/0303128 A1 | 12/2009 | Robert et al. | |
| 2010/0039343 A1* | 2/2010 | Uno et al. | 343/818 |
| 2011/0050527 A1 | 3/2011 | Anderson et al. | |
| 2013/0241788 A1 | 9/2013 | Anderson et al. | |
| 2013/0241791 A1 | 9/2013 | Anderson et al. | |

OTHER PUBLICATIONS

Office Action dated Jan. 30, 2014, U.S. Appl. No. 13/457,546, filed Apr. 27, 2012, pp. 1-20.
Office Action dated Jan. 30, 2014; for U.S. Appl. No. 13/457,546; 20 pages.
Applicant Initiated Interview Request Form dated Apr. 23, 2014; for U.S. Appl. No. 13/457,546; 3 pages.
Response dated Apr. 25, 2014 to Office Action dated Jan. 30, 2014; for U.S. Appl. No. 13/457,546; 27 pages.
Terminal Disclaimer filed Apr. 25, 2014; for U.S. Appl. No. 13/457,546; 2 pages.
Supplemental Amendment dated Apr. 29, 2014 to Response dated Apr. 25, 2014 to Office Action dated Jan. 1, 2014; for U.S. Appl. No. 3/457,546; 26 pages.
Applicant-Initiated Interview Summary dated May 12, 2014; for U.S. Appl. No. 13/457,546; 3 pages.
Final Office Action dated Jul. 14, 2014; for U.S. Appl. No. 13/457,546; 18 pages.
Applicant Initiated Interview Request Form dated Sep. 23, 2014; for U.S. Appl. No. 13/457,546; 3 pages.
Applicant-Initiated Interview Summary dated Oct. 1, 2014; for U.S. Appl. No. 13/457,546; 3 pages.
Response dated Oct. 14, 2014 to Final Office Action dated Jul. 14, 2014; for U.S. Appl. No. 13/457,546; 15 pages.
Notice of Appeal dated Oct. 14, 2014; for U.S. Appl. No. 13/457,546; 1 page.
Advisory Action Before the Filing of an Appeal Brief dated Nov. 14, 2014; for U.S. Appl. No. 13/457,546; 3 pages.
Advisory Action Before the Filing of an Appeal Brief dated Nov. 28, 2014; for U.S. Appl. No. 13/457,546; 3 pages.
Appeal Brief dated Jan. 24, 2015 in Response to Final Office Action dated Jul. 14, 2014; for U.S. Appl. No. 13/457,546; 41 pages.
Notification of Non-Compliant Appeal Brief dated Mar. 2, 2015; for U.S. Appl. No. 13/457,546; 3 pages.
Response dated Mar. 17, 2015 to Notification of Non-Compliant Appeal Brief dated Mar. 2, 2015; for U.S. Appl. No. 13/457,546; 6 pages.
Examiner's Answer dated Sep. 1, 2015 in Response to Appeal Brief dated Jan. 14, 2015; for U.S. Appl. No. 13/457,546; 13 pages.
Reply Brief dated Oct. 15, 2015 to Examiner's Answer dated Sep. 1, 2015; for U.S. Appl. No. 13/457,546; 10 pages.
Patent Trial and Appeal Board Docketing Notice dated Nov. 6, 2015; for U.S. Appl. No. 13/457,546; 2 pages.
Office Action dated Jan. 30, 2014; for U.S. Appl. No. 13/457,547; 22 pages.
Applicant Initiated Interview Request Form dated Apr. 24, 2014; for U.S. Appl. No. 13/457,547; 3 pages.
Response dated May 1, 2014 to Office Action dated Jan. 30, 2014; for U.S. Appl. No. 13/457,547; 28 pages.
Applicant-Initiated Interview Summary dated May 12, 2014; for U.S. Appl. No. 13/457,547; 3 pages.
Final Office Action dated Jul. 14, 2014; for U.S. Appl. No. 13/457,547; 19 pages.
Applicant-Initiated Interview Summary dated Oct. 2, 2014; for U.S. Appl. No. 13/457,547; 3 pages.
Response dated Oct. 14, 2014 to Final Office Action dated Jul. 14, 2014; for U.S. Appl. No. 13/457,547; 15 pages.
Notice of Appeal dated Oct. 14, 2014; for U.S. Appl. No. 13/457,547; 1 page.
Appeal Brief dated Jan. 14, 2015 in Response to Final Office Action dated Jul. 14, 2014; for U.S. Appl. No. 13/457,547; 43 pages.
Advisory Action Before the Filing of an Appeal Brief dated Mar. 26, 2015; for U.S. Appl. No. 13/457,547; 3 pages.
Examiner's Answer dated Jun. 3, 2015 in Response to Appeal Brief dated Jan. 14, 2015; for U.S. Appl. No. 13/457,547; 13 pages.
Reply Brief dated Jul. 31, 2015 to Examiner's Answer dated Jun. 3, 2015; for U.S. Appl. No. 13/457,547; 10 pages.
Patent Trial and Appeal Board Docketing Notice dated Aug. 10, 2015; for U.S. Appl. No. 13/457,547; 2 pages.
PCT International Search Report and Written Opinion of the ISA dated Apr. 18, 2013; for PCT App. No. PCT/US2012/067587; 12 pages.
PCT International Search Report and Written Opinion of the ISA dated Apr. 23, 2013; for PCT App. No. PCT/US2012/067582; 11 pages.
PCT International Preliminary Report on Patentability and Written Opinion of the ISA dated Sep. 25, 2014; for PCT App. No. PCT/US2012/067587; 6 pages.
PCT International Preliminary Report on Patentability and Written Opinion of the ISA dated Sep. 25, 2014; for PCT App. No. PCT/US2012/067582; 6 pages.
European Patent Office Intention to Grant dated Apr. 13, 2015; for European Pat. App. No. 12 816 164.3-1812; 37 pages.
European Patent Office Intention to Grant dated Apr. 14, 2015; for European Pat. App. No. 12 799 472.1-1812; 25 pages.
Bell, Jodie M. et al.; "A Low-Profile Archimedean Spiral Antenna Using an EBG Ground Plane;" IEEE Antennas and Wireless Propagation Letters, vol. 3, 2004; pp. 223-226 (4 pages).
"Chapter 13: Waveguides;" *Naval Shore Electronics Criteria: Installation Standards and Practices*, Department of the Navy, Navel Electronic Systems Command, Washington, D.C., Jun. 1972; pp. 13-1-13-31 (32 pages).
Chun et al.; "Modeling and Characterization of Cavity Backed Circular Aperture Antenna with Suspended Stripline Probe Feed;" NASA Glen Research Center, Jun. 2000; pp. 1-4 (10 pages).
Demarest, Kenneth; "Waveguide: Waveguide Modes;" *The Electronics* Handbook, CRC Press with IEEE Press, 1996; pp. 259-269 (12 pages).
Lai, Anthony et al.; "Infinite Wavelength Resonant Antennas with Monopolar Radiation Pattern Based on Periodic Structures;" IEEE Transaction on Antennas and Propagation, vol. 55, No. 3, Mar. 2007; pp. 868-876 (9 pages).
Palmer, Katie M.; "Intellectual Ventures Invents Beam-Steering Metamaterials Antenna;" IEEE Spectrum, Nov. 30, 2011; 2 pages.
Rammos, E.; "A New Wideband, High Gain Suspended Substrate Line Planar Array for 12 GHz Satellite T.V.;" IEEE 13th Annual Microwave Conference, Sep. 1983; pp. 227-231 (5 pages).

* cited by examiner

BEAM-STEERED WIDE BANDWIDTH ELECTROMAGNETIC BAND GAP ANTENNA

BACKGROUND

To establish communications links for aircraft, missiles, satellites and the like requires antennas having high bandwidth and high gain that can be mounted flush with a skin of a missile, aircraft or other platform and packaged in a limited volume. Higher bandwidths and higher gains are often needed to satisfy ever increasing requirements for communication distance and data rate. The product typically communicates to its deployment platform, i.e. the vehicle antenna gain must be directed toward its launch point. Flush mounted antennas minimize aerodynamic effects for an underlying platform. A volume-limited antenna can reduce or ideally minimize mass impact (that is, a smaller antenna may weigh less and consequently reduce the overall weight of the missile or aircraft in which it is mounted). Hence, there is a need for an antenna that is beam-steered, has high gain, wide bandwidth, is flush-mounted, and volume-limited. It would, therefore, be desirable to provide an antenna design capable of achieving any combination of the above-described qualities or all of these qualities.

SUMMARY

In accordance with one aspect of the concepts, systems, circuits, and techniques described herein, an antenna comprises a microstrip patch antenna with an electromagnetic band gap (EBG) structure that is flush-mounted within a conductive cavity. The microstrip patch antenna provides a very low-profile radiating mechanism. The EBG structure is a physically realizable magnetic conductor having phase reflection and surface-wave band gap characteristics. These characteristics, including the impact of the conductive cavity, result in an antenna having wide bandwidth and gain characteristics and also allow for beam-steering. In one embodiment, the microstrip patch antenna and the EBG structure are both flush-mounted into a conductive cavity. The entire structure fits within a volume-limited form factor having a width equal to 0.45*wavelength, a length equal to 0.54*wavelength, and a height equal to 0.07*wavelength.

The position of the radiating mechanism (e.g. a radiating element such as a patch antenna) within the cavity, the presence of the EBG structure, and material having a high relative dielectric constant (e.g. Rogers TMM10i) provides the beam-steering. The capacitance from the cavity walls and the EBG structure increases the bandwidth and enhances beam steering.

In accordance with one aspect of the concepts, systems, circuits, and techniques described herein, an antenna includes, a ground plane; an electromagnetic band gap (EBG) structure disposed about the ground plane, the EBG structure having a number of unit cells arranged in rows and columns wherein the rows and columns defined two orthogonal axes; a radiating element disposed above the EBG structure, the radiating element having a long dimension and a short dimension wherein one of the long and short dimensions is aligned along at least one of the two orthogonal axes defined by the rows and columns of the EBG structure; and a conductive cavity defined by sidewalls and a bottom surface, the conductive cavity encompassing the EBG structure and the radiating element, the conductive cavity being open on a radiating side of the antenna.

With this particular arrangement, a beam-steered, wide bandwidth, electromagnetic band gap antenna is provided. This antenna concept incorporates a microstrip patch antenna above a electromagnetic band gap (EBG) structure that is flush-mounted into a cavity and provides wide impedance bandwidth and fixed beam steering.

Unique features of the microstrip EBG antenna include but are not limited to: (1) fixed beam steering; (2) significant improvement in gain on the horizon; (3) wide angular coverage; (4) stable fixed beam steering throughout impedance bandwidth; (5) wide impedance bandwidth; (6) ample bandwidth for most datalinks systems; (7) entire antenna assembly, including a radome, is flush-mounted into a cavity to minimize aerodynamic impact; (8) small footprint and high volume efficiency: 0.54λ×0.45λ×0.07λ; (9) very low-profile (0.262 in thick in one exemplary embodiment); (10) can be used as a single element or in an array of elements; (11) could be used for datalink antennas across all product lines; (12) requires only standard PCB materials and fabrication processes.

In one exemplary embodiment, the entire antenna structure, including a radome, is flush-mounted into a small volume cavity to minimize aerodynamic impact that can be supported on small missile airframes.

It is noted that prior attempted solutions fail to provide the improvement in gain on the horizon and impedance bandwidth within the same volume while at the same time requiring fabrication processes which are relatively expensive compared with the fabrication processes which can be used for the above described antenna.

The antenna described herein finds use in a number of applications including, but not limited to: (1) active or passive antenna elements for missile sensors requiring highly directive, wide bandwidth RF performance within a small volume; (2) land-based and sea-based communication and datalinks; (3) applications unrelated to datalinks such as rear reference antennas; (4) non-defense applications including, but not limited to: (a) directive antennas for commercial aircrafts to send/receive telemetry with higher data rates; and (b) useful for automobiles for personal communication, cellular signals, traffic updates, emergency response communication. The antenna described herein could also find use in medical imaging.

In one embodiment, the EBG structure, the radiating element, and the conductive cavity are configured together to achieve an enhanced operational bandwidth.

In one embodiment, the antenna is configured for use with linearly polarized waves.

In one embodiment, the radiating element includes one of: a patch element, a PIFA (Planar Inverted F Antenna), a dipole element, and a monopole element.

In one embodiment, the antenna further comprises a feed circuit coupled to the radiating element through the ground plane and the EBG structure.

In one embodiment, the bottom surface of the conductive cavity corresponds to the ground plane of the antenna assembly.

In one embodiment, the antenna further includes a radome covering an upper surface of the radiating element.

In one embodiment, an upper surface of the radome is substantially flush with an upper edge of the conductive cavity.

In one embodiment, an upper surface of the radiating element is substantially flush with an upper edge of the conductive cavity.

In one embodiment, the conductive cavity is formed within an outer skin of a vehicle; and an upper surface of the antenna is flush with the outer skin of the vehicle.

In one embodiment, the vehicle includes one of: a ground vehicle, a watercraft, an aircraft, a missile, a projectile, and a spacecraft.

In one embodiment, a length, a width, and a height of the conductive cavity are each less than a wavelength at the center frequency of the antenna.

In one embodiment, the antenna is conformal to a curved surface of a mounting platform.

In one embodiment, the radiating element is a first radiating element of a plurality of radiating elements each of the plurality of radiating elements disposed above the EBG structure, and having a long dimension and a short dimension, and an orientation that is orthogonal to an orientation of at least one other one of the plurality of radiating elements, wherein at least some of the radiating elements are disposed on different layers of the antenna.

In accordance with another aspect of the concepts, systems, circuits, and techniques described herein, an antenna assembly includes an electromagnetic band gap (EBG) structure having first and second opposing surfaces and a plurality of unit cells disposed there between, with the unit cells arranged in rows and columns which define two orthogonal axes; and a radiating element disposed over a first one of the first and second opposing surfaces of the EBG structure, the radiating element having a long dimension and a short dimension, the radiating element being held in a fixed position with respect to the EBG structure such that one of the long and short dimensions of the radiating element is aligned with at least one of the orthogonal axes defined by the rows and columns of the EBG structure.

In one embodiment, the antenna assembly further includes a ground plane disposed over a second one of the first and second opposing surfaces of the EBG structure.

In one embodiment, the antenna assembly is configured for insertion into a conductive cavity having dimensions that are selected to form an antenna having radiation performance that is characteristic of a larger antenna.

In one embodiment, the antenna further includes a feed circuit coupled to the radiating element through the EBG structure.

In one embodiment, the radiating element is one of: a patch element, a PIFA (Planar Inverted F Antenna), a dipole element and a monopole element.

In one embodiment, the antenna assembly is configured for insertion into a conductive cavity within an outer skin of a vehicle and the antenna assembly has a height that allows the antenna assembly to be mounted in the conductive cavity substantially flush to the outer skin of the vehicle.

In accordance with a still another aspect of the concepts, systems, circuits, and techniques described herein, a method is provided for designing an antenna having a radiating element disposed above an electromagnetic band gap (EBG) structure within a conductive cavity, the radiating element being aligned with respect to the EBG structure. More specifically, the method comprises: determining an approximate size of the conductive cavity; selecting a dielectric material and a number and arrangement of unit cells to use in the EBG structure that will fit within the approximate size of the conductive cavity; selecting a radiating element; designing a unit cell of the EBG structure that will result in the antenna assembly having desired antenna response characteristics, wherein designing a unit cell takes into consideration performance effects of the conductive cavity on the operation of the EBG structure; and adjusting a size of at least the conductive cavity to achieve an enhanced bandwidth for the antenna.

In one embodiment, designing a unit cell of the EBG structure includes using electromagnetic simulation software.

In one embodiment, designing a unit cell of the EBG structure includes modeling a capacitance between walls of the conductive cavity and edges of the EBG structure.

In one embodiment, the method further comprises selecting a second radiating element to be mounted above the EBG structure and the first radiating element, the second radiating element to be oriented in a direction that is orthogonal to an orientation direction of the first radiating element.

BRIEF DESCRIPTION OF THE DRAWINGS

The foregoing features may be more fully understood from the following description of the drawings in which:

FIGS. 3 and 3A are cross-sectional side views of an exemplary beam-steered, wide bandwidth electromagnetic band gap antenna element, in which

DETAILED DESCRIPTION

The subject matter described herein relates to microstrip electromagnetic bandgap (EBG) antenna designs that are capable of providing high gain, fixed beam steering, wide angular coverage and wide bandwidth from a relatively small, low profile package. The antenna designs are particularly well suited for use in antenna applications requiring flush mounting (e.g., airborne applications, conformal arrays, etc.). The antenna designs are also well suited for use in other applications where small antenna size is desired, such as hand held wireless communicators and wireless networking products. In some implementations, the antenna designs may be used for most datalinks systems.

In various embodiments described herein, antennas are provided that include a radiating element held in a fixed orientation and disposed over an EBG structure, with both the radiating element and the EBG structure mounted within a conductive cavity. The radiating element may be disposed to provide the antenna having a desired response characteristic for x-polarization and y-polarization. As will be described in greater detail, the conductive cavity allows the antenna to be flush-mounted if desired (and thus appropriate for applications requiring a conformal antenna) and, with proper design, also permits an increase in bandwidth to be achieved.

EBG structures are periodic structures that exhibit interesting qualities in the presence of electromagnetic waves. One property of EBG structures that has proven very useful in the field of antennas is the ability to, at least in part, act as a magnetic conductor surface. As is well known, an electromagnetic wave incident upon a perfect electric conductor surface will be reflected with a phase change of 180 degrees. Conversely, an electromagnetic wave incident upon a perfect magnetic conductor surface, if such a thing could exist, would be reflected with a phase change of zero degrees. EBG structures can be designed that reflect electromagnetic waves at desired angles between zero and 180 degrees In the discussion that follows, a right-hand Cartesian coordinate system (CCS) will be assumed when describing the various antenna structures. To simplify description, the direction normal to the face of an antenna will be used as the z-direction of the CCS (with unit vector z), the direction along a longer side of the antenna will be used as the x-direction (with unit vector x), and the direction along a shorter side of the antenna will be used as the y direction (with unit vector y). It should be appreciated that the structures illustrated in the various figures disclosed herein are not necessarily to scale. That is, one or more dimensions in the figures may be exaggerated to, for example, increase clarity and facilitate understanding.

In general overview, described herein is an antenna provided from a printed circuit antenna (e.g. a microstrip patch antenna) coupled to an electromagnetic band gap (EBG) structure that is flush-mounted within a conductive cavity. The microstrip antenna provides a very low-profile radiating mechanism. The EBG structure is a physically realizable magnetic conductor having phase reflection and surface-wave band gap characteristics. These characteristics, including the conductive cavity, result in an antenna having wide bandwidth and gain characteristics and also allow for beam-steering. In particular, the position of the radiating mechanism (e.g. a radiating element such as a patch antenna) within the cavity, the presence of the EBG structure, and high dielectric constant material (e.g. Rogers TMM10i) provides the beam-steering while the capacitance from the cavity walls and the EBG structure increases the bandwidth and enhances beam steering.

The high gain and increased bandwidth is a result from properly designing radiating mechanism, EBG structure, and the cavity size. The boundary condition of the cavity walls create images of the EBG structure within the XY plane, i.e. images of the rows and columns are repeated. As a result, the effective radiating aperture area increases, hence increased gain and bandwidth. Moreover, the combination of the radiating mechanism, its position, EBG structure, cavity size, and high dielectric constant provides a beam steering capability. This beam steering is a result of the overall constructive/destructive interference of the following radiating components: radiation from the radiation mechanism (its position and high dielectric constant impacts this), radiation of the EBG structure (the high dielectric constant impacts this as well), and lastly, the radiation from the edges of the cavity walls. It is recognized herein that different beam steering responses can be achieved by appropriate design of the radiator, its position, EBG structure, dielectric constant, and edges of the cavity walls (by texturing, or different geometry). Accordingly, while one exemplary combination of elements is described herein to provide beam steering, it should be understood that many other combinations exists as well and after reading the disclosure provided herein, a person of ordinary skill in the art will understand how to provide an antenna having a desired beam steering characteristic.

In one embodiment, the microstrip patch antenna and the EBG structure are both flush-mounted into a cavity in a conductive ground plane.

Figure 1:
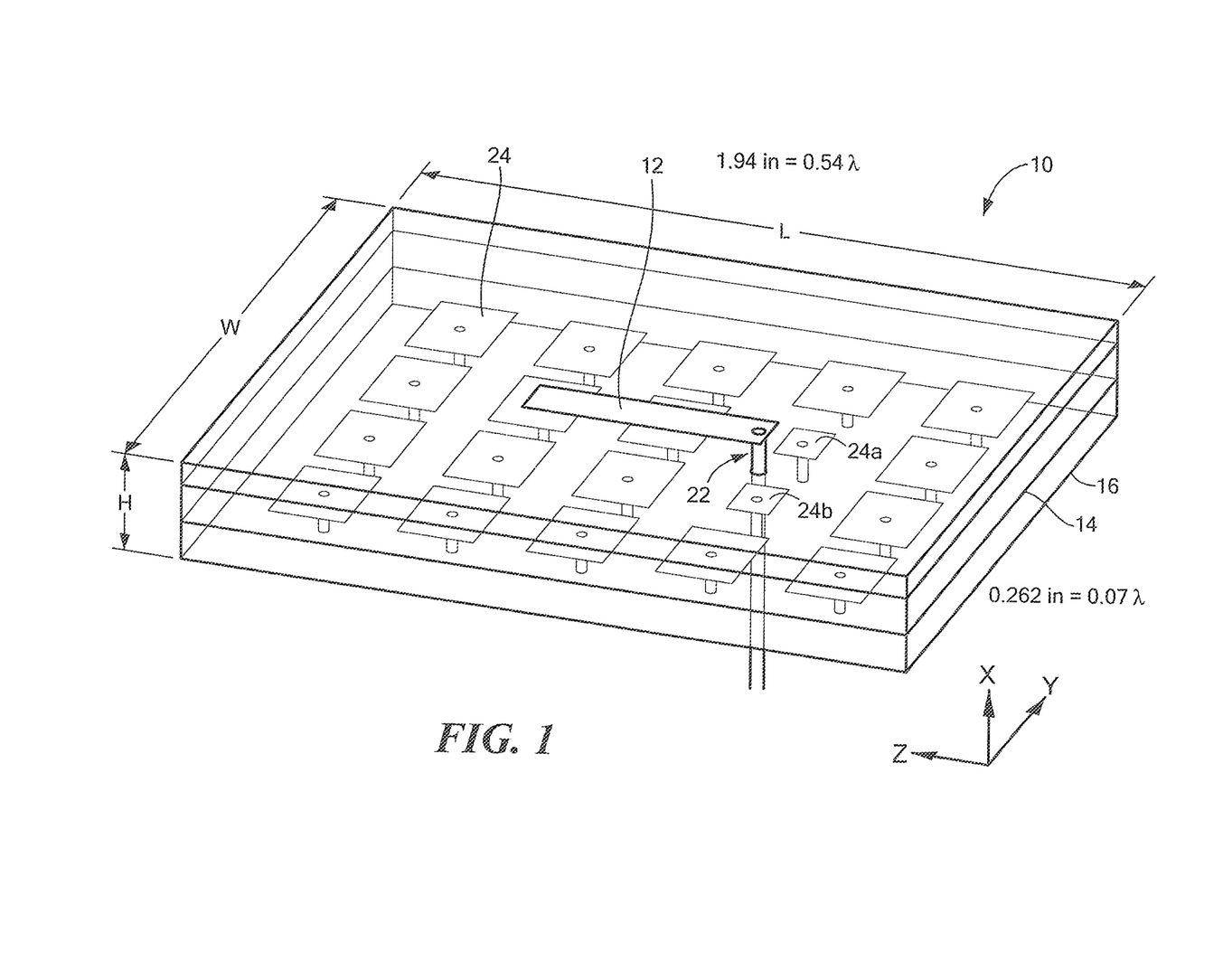
FIG. 1 is an isometric view of an exemplary beam-steered, wide bandwidth electromagnetic band gap (EBG) antenna assembly.

Referring now to FIG. 1, an exemplary EBG antenna assembly 10 includes a radiating element 12 mounted above (or otherwise disposed over) an EBG structure 14. Radiating element 12 may be provided as a printed circuit element. For example, radiating element may be provided as: a patch element, PIFA (Planar Inverted F Antenna), a dipole element or a monopole element.

A ground plane 16 is provided below EBG structure 14. EBG antenna assembly 10 is provided having a length L, a width W and a height H. In one embodiment, antenna assembly 10 fits within a volume-limited form factor having a length equal to 0.54*wavelength, a width equal to 0.45*wavelength and a height equal to 0.07*wavelength (i.e. L=0.54*λ, W=0.45*λ and H=0.07*λ, where λ is the free-space wavelength). Specific dimensions of an EBG antenna assembly may vary from the above depending upon a variety of factors including, but not limited to, antenna operating frequency, impedance bandwidth, desired beam steering angle, characteristics of materials used in the fabrication of the EBG antenna assembly (e.g. relative dielectric constant).

EBG structure 14 includes a plurality of conductive elements 24 or more simply conductors 24 or patches 24 which may be arranged in a periodic fashion (e.g., equally spaced rows and columns). As will be described in conjunction with FIG. 3 below, conductors 24 are part of a unit cell. Conductors 24 may be provided from any type of conductive material or from a substantially non-conductive base material made to be conductive (e.g. via a metallization or doping process). Although conductors 24 in FIG. 1 are shown having a square shape and arranged in a rectangular lattice, conductors 24 may also be provided having other shapes including but not limited to rectangular, hexagonal, triangular, elliptical or circular shapes. Other lattice patterns could also be used (e.g. conductors can be disposed in any lattice pattern having a regular or irregular shape with regular or irregular spacing. Lattice patterns including, but not limited to rectangular, hexagonal, triangular, elliptical or circular may be used. The size, shape, lattice pattern and proximity (e.g. spacing) of the various conductors 24 will, to a large extent, dictate the operational properties of the EBG structure 14. Those of ordinary skill in the art will appreciate how to select the size and shape of conductors 24 to achieve desired antenna properties for any particular application (e.g. using analytical and/or empirical techniques).

A feed circuit 22 is coupled to radiating element 12 such that radio frequency (RF) signals may be coupled to/from the radiating element 12 from feed circuit 22. In the exemplary embodiment of FIG. 1, feed circuit 22 is provided from an RF coaxial signal path (i.e. it is a coaxial feed) having a first end coupled to radiating element 12 and extending through EBG structure 14 and ground plane 16 in a manner known to those of ordinary skill in the art. Other techniques for coupling RF signal to/from the radiating element 12 may alternatively be used. For example, feed circuit 22 may be implemented via a capacitive coupling technique. It should be appreciated that there are multiple ways in which to capacitively couple to the radiating element and still achieve high gain, increased bandwidth, and beam steering. It should be understood that for this capacitively coupled structure, the radiator need not be on the same layer as the EBG structure, but it could be on the same layer. The high gain, increased bandwidth, and beam steering can then be achieved by following the techniques described herein.

It should be appreciated that conductors 24a, 24b proximate feed circuit 22 are a different size, here smaller, than other ones of conductors 24. The size and shape of conductors 24a, 24b are selected to facilitate fabrication of EBG antenna assembly (e.g. to prevent coaxial feed from electrically contacting conductors 24a, 24b) and also to provide a tuning structure to improve the impedance bandwidth of the EBG antenna assembly over a desired bandwidth and also to reduce mechanical interference between the feed circuit 22 and/or radiating element 12 and conductors 24a, 24b. The amount by which the size of conductors 24A, 24B may be reduced is highly dependent upon a variety of factors including but not limited to: the radiating mechanism, dielectric constant, cavity size, frequency of operation, etc.

To facilitate operation with horizontally and vertically-polarized signals, as will be described in greater detail, the radiating element 12 is aligned with respect to an axis of conductors 24 of EBG structure 14 (i.e., a central longitudinal axis of radiating element 12 is aligned with the x or y axes in FIG. 1).

Figure 1A:
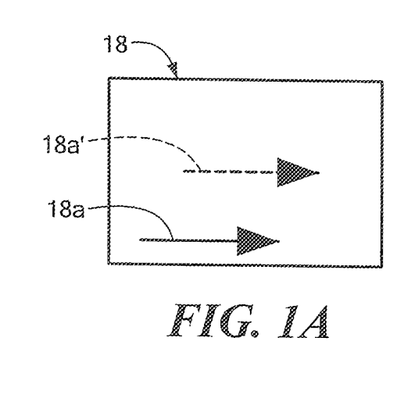
FIG. 1A is a top view of a cavity of an exemplary beam-steered, wide bandwidth electromagnetic band gap (EBG) antenna assembly having an offset radiator.
Figure 1B:
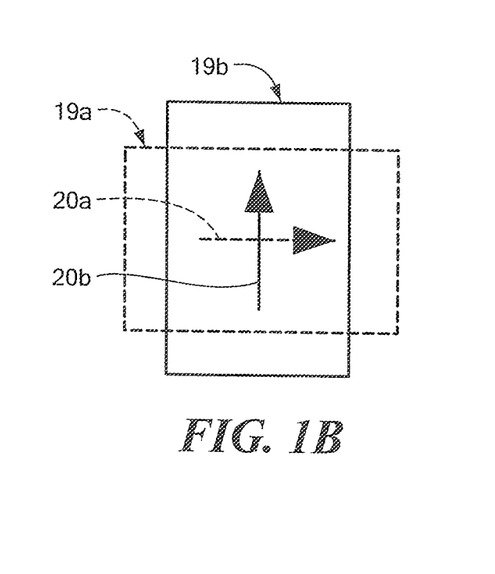
FIG. 1B is a top view of a pair of cavities with orthogonally disposed radiators.
Figure 1C:
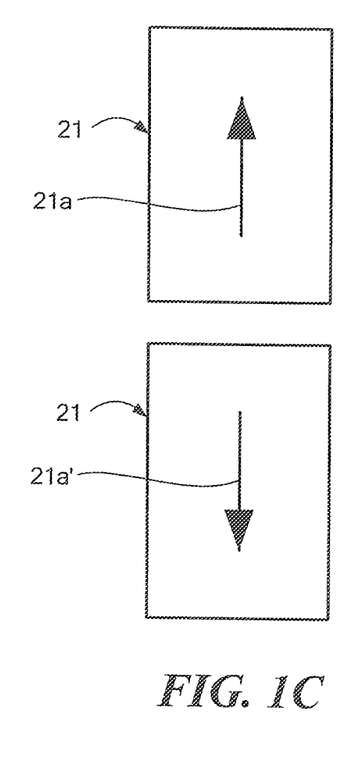
FIG. 1C is a top view of a pair of cavities having +y and −y polarizations.

Although in FIG. 1, radiating element 12 is shown as being disposed along a longitudinal centerline of the cavity, in some applications it may be desirable to offset radiating element 12 to adjust beam steering angle, as shown in FIG. 1C, for example.

Referring now to FIG. 1A, a cavity structure 18 has an offset radiator 18a disposed therein (i.e. radiator 18a is offset from the cavity centerline along which radiator 18a'—shown in phantom in FIG. 1A—is disposed). It should be appreciated that in the exemplary embodiment of FIG. 1A, offset radiator 18a is shown as being offset with respect to the cavity centerline in both the x and y directions. It should, of course, be understood that in some embodiments it may be desirable to offset radiator 18a with respect to the cavity centerline in only one directions (e.g. only the +x direction of the −x direction or the +y direction or the −y direction. Having the radiator with an offset in the x-direction introduces some beam steering in the E-plane while having the radiator with an offset in the y-direction introduces some beam steering in the H-plane. Having the radiator with an offset in both the x and y directions (as shown on FIG. 1A) will introduce some beam steering in both the E and H-planes. It should also be appreciated that while the offset is here shown being toward the −x and −y directions (with reference to the coordinate system shown in FIG. 1A) with respect to the centerline of the cavity, those of ordinary skill in the art should will also appreciate that the radiator may be offset in any direction with respect to the cavity centerline.

Furthermore, a second EBG antenna assembly (not shown in FIG. 1) could be disposed such that it is responsive to RF signals having an electric field orientation which is orthogonal to the orientation of the electric field to which radiator 12 is responsive. Thus, by utilizing EBG antenna assemblies which are orthogonally disposed, an antenna can be provided which is response to orthogonal RF signals.

Referring now to FIG. 1B, for example, an exemplary antenna configuration includes a pair of cavities 19a, 19b with cavity structure 19a supporting an x polarization designated with reference numeral 20a in FIG. 1B (i.e. polarization of a radiating element such as element 12 in FIG. 1) and cavity structure 19b supporting a y polarization designated with reference numeral 20b in FIG. 1B (i.e. polarization of a radiating element such as element 12 in FIG. 1). It should be appreciated that steering relies on cavity length rather than cavity width. It should be appreciated that multiple polarizations can be achieved by switching between the radiating elements. Circular polarization can be obtained if both polarizations are coupled to an external 90 degree hybrid (not shown). Additionally simultaneous dual linear polarization may be achieved with individual feeds for each polarization. It should be noted that for reasons of clarity in the drawings, EBG structures are not shown in FIGS. 1A-1C. FIG. 1C illustrates an embodiment a pair of cavity structures 21 utilizing +y and −y polarizations respectively designated with reference numerals 21a and 21a' in FIG. 1C.

Figure 2:
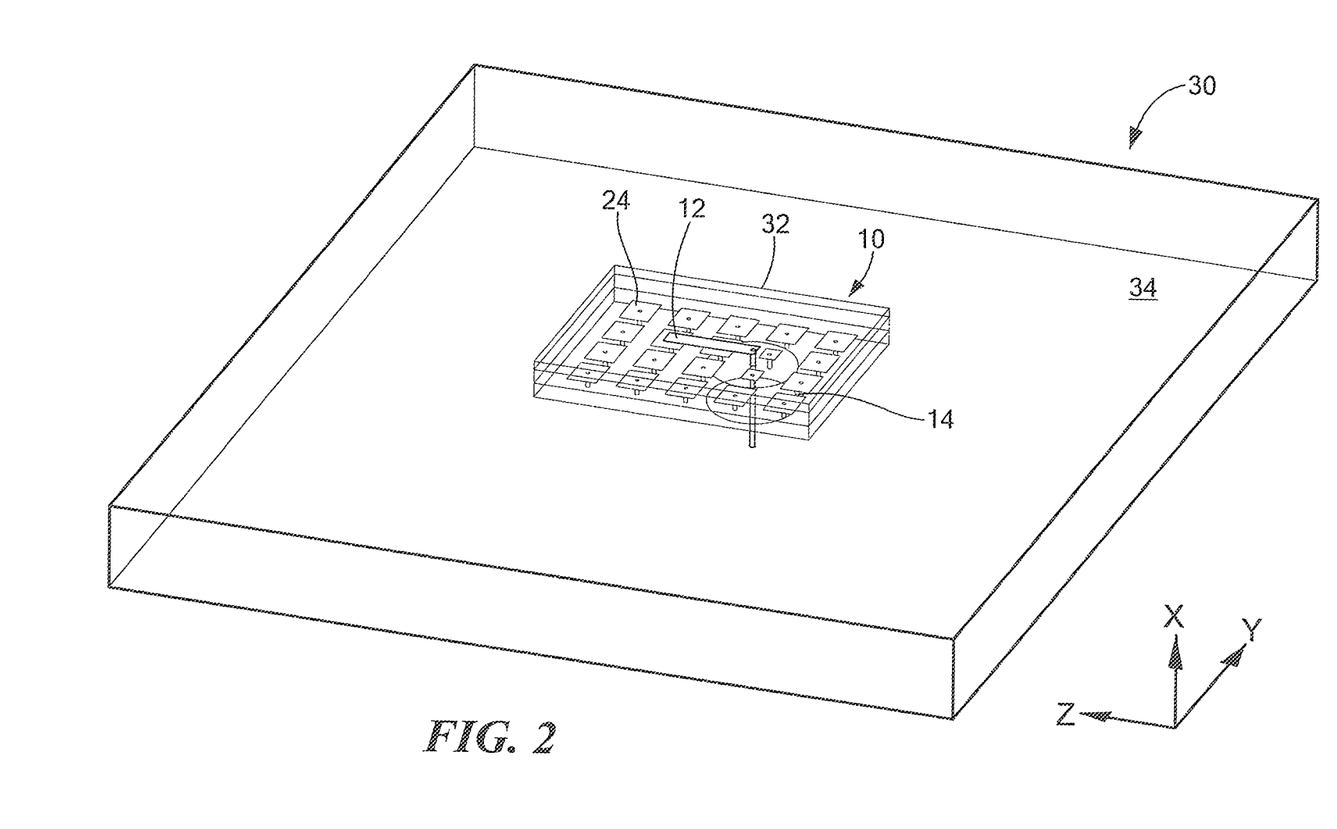
FIG. 2 is an isometric view of the exemplary beam-steered, wide bandwidth electromagnetic band gap antenna element of FIG. 1 mounted within a conductive cavity.

Referring now to FIG. 2 in which like elements of FIG. 1 are provided having like reference designations, the antenna assembly 10 of FIG. 1 is mounted (or otherwise disposed) within a conductive cavity 32 formed in a ground plane 34 to form an antenna 30. In some implementations, the antenna assembly 10 may be mounted within the conductive cavity 32 so that an outermost surface of the antenna assembly 10 is flush with a surface 34 associated with the conductive cavity 32 (e.g., a conductive surface within which the cavity 32 is formed). As is well known, flush mounting may be desired to reduce the aerodynamic impact of the antenna 30 in certain applications. The antennas and techniques described herein are not limited to use in flush mounted applications, however. In some embodiments, the conductive cavity 32 may include, for example, a depression within an outer conductive skin 34 of a vehicle (e.g., a ground vehicle, an aircraft, a missile, a spacecraft, a watercraft, etc.).

The antenna assembly 10 may be fixed within the conductive cavity 32 in any known manner including using, for example, an adhesive, solder, a compression fit, clamps, or any other technique that is capable of securing the assembly 10 in place. In some embodiments, instead of first forming the antenna assembly 10 and then mounting it within the cavity 32, the EBG structure 14 and the radiating element 12 may be assembled within the conductive cavity 32. In the illustrated embodiment, an elongated patch radiating element 12 is used in the antenna 30. It should be appreciated, however, that any type of element may be used that can operate as a linear electric field source.

Figure 3:
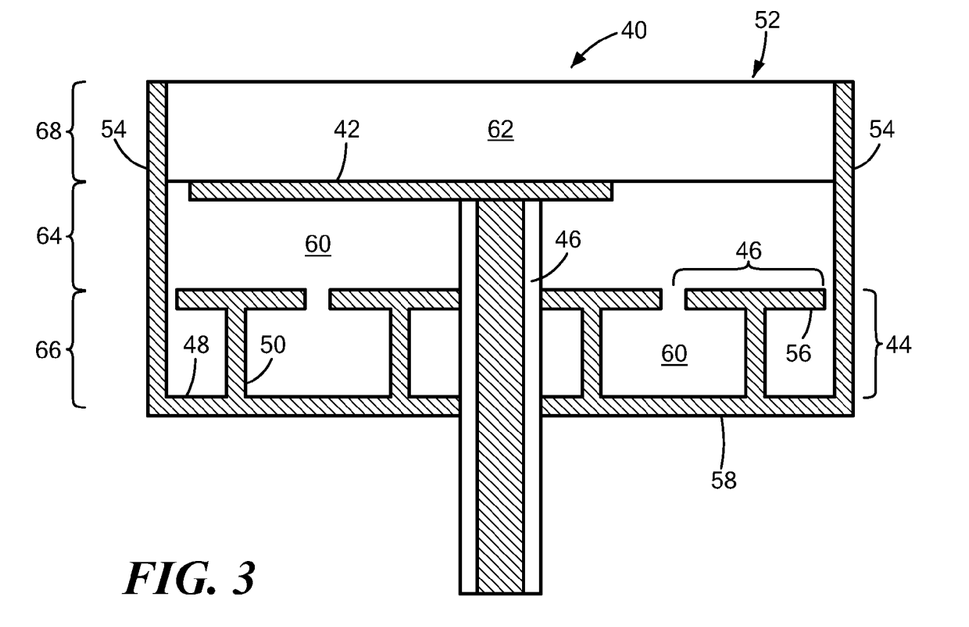
FIG. 3 illustrates an antenna element having a single radiating element and FIG. 3A illustrates an antenna element having a plurality of radiating elements.
Figure 3A:
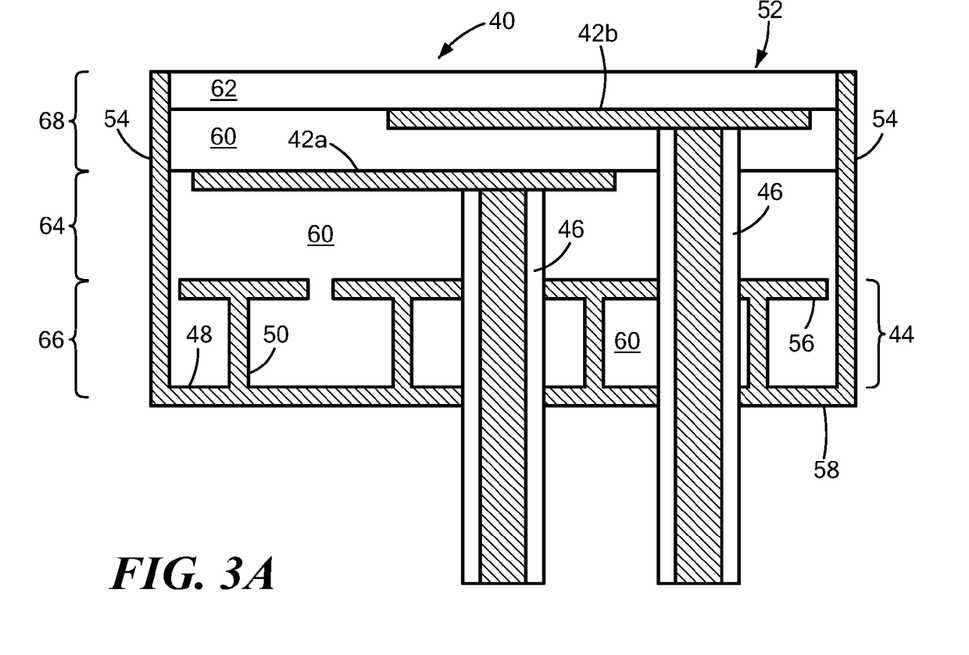

FIG. 3 is a cross-sectional sectional side view of a portion of an antenna 40 which may be the same as or similar to EBG antenna assembly 10 (FIG. 1) or antenna 30 (FIG. 2). As shown, the antenna 40 includes a radiating element 42 disposed above an EBG structure 44, within a conductive cavity formed by conductive sidewalls 52 and a conductive bottom or floor portion 58. In some embodiments, and as illustrated in FIG. 3A, a plurality of radiating elements 42a, 42b are disposed above EBG structure 44, and within the conductive cavity formed by conductive sidewalls 52 and the conductive bottom or floor portion 58. The conductive side and bottom walls 52, 58 which form the cavity may be provided from a conductive material or alternatively may be provided from a dielectric material (e.g., an injection molded material) having a conductive layer disposed thereover. Alternatively, the cavity may be provided from a plurality of tightly spaced conductive via holes. Alternatively still, the cavity may be provided using any one or any combination of the aforementioned techniques or may be provided using any other technique known to those of ordinary skill in the art.

One requirement being that the EBG antenna assembly fit tightly within the cavity that is formed.

The EBG structure 44 includes a plurality of unit cells 46 formed situated above a ground plane 48 which in this exemplary embodiment is a surface of floor 58. Each unit cell 46 includes a conductive EBG element 56 that is conductively coupled to the ground plane 48 by a conductive connection 50 which may, for example, be provided as a plated through hole having a first end coupled to EBG element 56 and a second end coupled to ground plane 48. In the illustrated embodiment, the EBG structure 44 is a particular form of EBG structure known as a mushroom EBG. A coaxial feed 46 is disposed to couple RF signals to/from the radiating element 42. As shown, coaxial feed 46 extends through the ground plane 48 and the EBG structure 44.

The conductive cavity 52 of FIG. 3 includes wall portions 54 and a floor portion 58. The wall portions 54 may surround the radiating element 42 and the EBG structure 44 on all sides. The antenna 40 will transmit and/or receive electromagnetic signals through a top of the cavity 52 which remains open. In some embodiments, the floor portion 58 of the conductive cavity 52 may serve as the ground plane 48 of the antenna. In other embodiments, a separate ground plane 48 may be provided. Dielectric material 60 may fill the gaps between the conductive elements of the antenna 40. A dielectric radome 62 may be provided above the radiating element 42 to, among other things, protect the radiating element 42 and other circuitry from an exterior environment. In some implementations, an upper surface of the radome 62 may be flush with an upper edge of the cavity 52 (although this is not required).

The antenna designs of FIGS. 1, 2, and 3 may be built in any of a variety of ways. In some embodiments, these designs may be formed using relatively simple and well known printed circuit board (PCB) techniques. Thus, with reference to FIG. 3, radiating element 42 may include a metallic trace patterned on an upper surface of a first dielectric board 64 and the conductive elements 56 of EBG structure 44 may include metallic traces patterned on an upper surface of a second dielectric board 66. Ground plane 48 may include a metallization layer on a lower surface of the second dielectric board 66. The conductive connections 50 may be formed using via connections (plated-through holes) extending through the second dielectric board. A lamination process may be used to fuse together the first and second dielectric boards 63, 66 to form a multi-layer board assembly. In some implementations, another layer of dielectric board material 68 may be laminated over the top of the radiating element 42 to serve as the radome 62.

As described previously, the conductive cavity 52 within which radiating element 42 and EBG structure 44 are housed may include a recess within a conductive surface associated with a mounting platform (e.g., a vehicle, etc.). In some embodiments, however, the walls 54 and the floor 58 of the cavity 52 may be deposited or otherwise formed about the other elements of the antenna 40 before mounting. The resulting assembly, with the cavity walls already formed, may then be mounted to a mounting surface. Other techniques for forming the antenna structures of FIGS. 1, 2, and 3 may alternatively be used as long as the dimensions, geometries, and structures are maintained. These other techniques may include, for example, additive manufacturing (e.g., 3D printing), direct energy deposition, 3D lamination, and/or others.

With reference to FIG. 3, to achieve enhanced performance characteristics, the radiating element 42, the EBG structure 44, and the conductive cavity 52 are designed together. Traditionally, it has been considered a detriment to mount an antenna within a cavity. That is, the overall performance of the resulting antenna was invariably thought to be worse than the performance of the same antenna without a cavity. It has been found, however, that careful design of all elements together can result in an antenna within a cavity that has performance characteristics that exceed those of a similar antenna without a cavity. In some cases, an antenna can be achieved that performs like a much larger antenna, but within a smaller, more compact package. As will be described in greater detail, the design must take into account the effects that the cavity may have on the operation of other components of the antenna. This may include, for example, performance effects caused by capacitances between the walls 54 of the cavity 52 and the unit cells 46 of the EBG structure 44. In some embodiments, this may also include performance effects of capacitances between the walls 54 of the cavity 52 and the radiating element 42. In at least one implementation, the cavity 52 is used as an additional design variable to tune the antenna 40 for broadband operation. It was found that careful design of radiating mechanism, its position, etc. as described hereinabove, results in the described beam steering capability.

It should be appreciated that the antenna assemblies and antennas described herein requires only standard printed circuit board (PCB) materials and fabrication processes. Thus, the antenna assemblies and antennas described herein could be mass produced with low cost.

Figure 4:
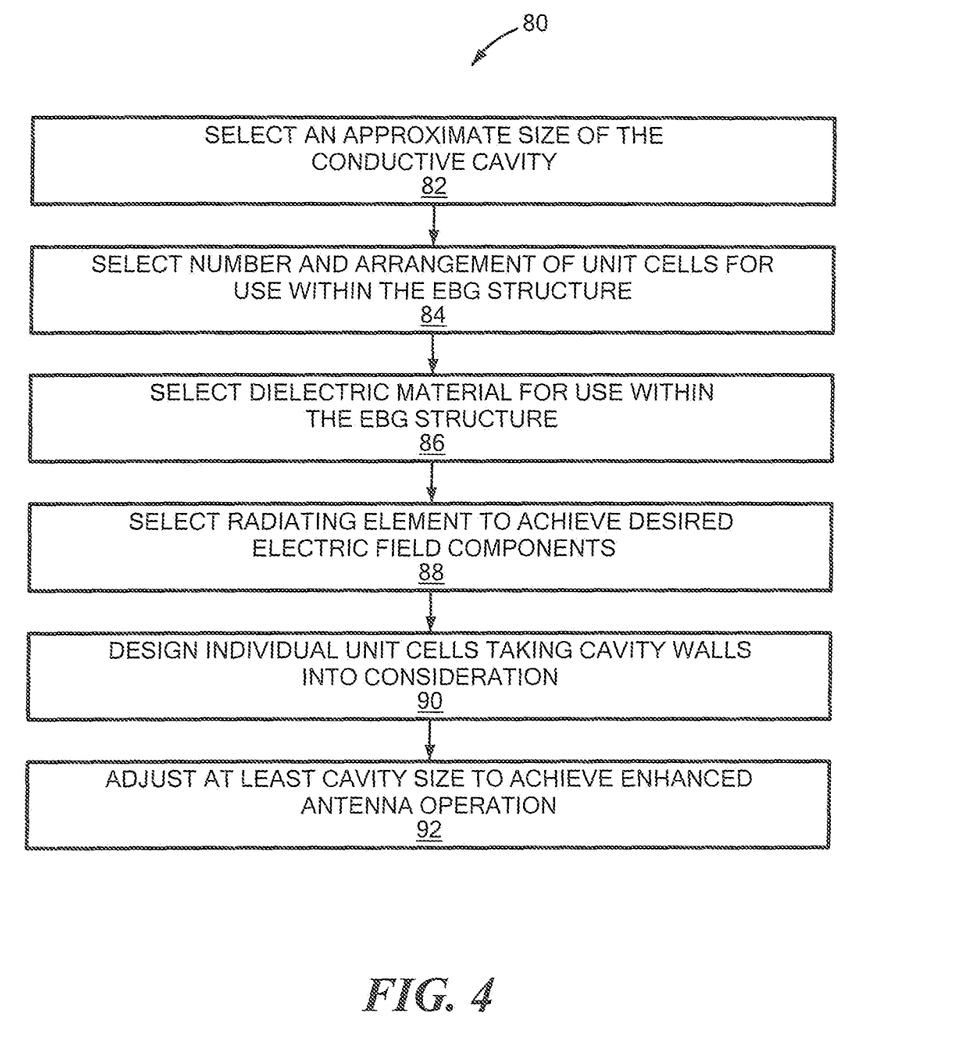
FIG. 4 is a flow diagram of method for designing a beam-steered, wide bandwidth electromagnetic band gap antenna.

FIG. 4 is a flowchart illustrating an exemplary method for designing an antenna in accordance with an embodiment. As shown, an approximate size of the conductive cavity of the antenna may first be determined (block 82). This approximate size may be dictated by, for example, the intended deployment location of the antenna or some other system requirement. Next, a number and arrangement of unit cells to use in the EBG structure may be selected (block 84). A dielectric material may also be selected that will allow this arrangement of unit cells to fit within the approximate cavity size (block 86). At some point, a radiating element may be selected to achieve desired horizontal and vertical field magnitudes for the antenna (block 88). The type of radiating element, as well as the size, shape, and orientation of the element, may be selected. The design of the individual unit cells may next be undertaken (block 90). Modeling may be done to determine the correct, desired characteristics of the EBG structure for the particular application for which the antenna is being designed. During this stage, the modeling may take into account the presence of the cavity walls and changes can be made to, for example, the dielectric material, the size of the unit cell elements, the size of the cavity, and/or other parameters to find values that work together to achieve an enhanced bandwidth or other antenna characteristics (block 92). Although illustrated in a particular order in FIG. 4, it should be understood that changes may be made to the order of the blocks in different implementations. In addition, it should be understood that two or more of the blocks may be implemented concurrently in various implementations. Computer design tools/software may be used to facilitate the modeling and design process in some embodiments (e.g., the Ansys HFSS™ 3D electromagnetic simulation tool, etc.).

In a typical EBG structure, there will be a capacitance between adjacent pairs of units cell elements. During the design process, the cavity may be thought of as providing additional capacitance (e.g., capacitance between the walls of the cavity and the outermost unit cells of the EBG structure) that can be used as a degree of freedom in the design. This capacitance may be adjusted by, for example, changing the distance between the cavity walls 54 and the outermost unit cells of the EBG structure. It was found that by appropriately selecting this capacitance, the EBG structure 44 could be made to appear as though it had an image of additional rows and columns of unit cells. By making the EBG structures appear larger, the effective aperture appears larger and enhanced gain and impedance bandwidth can be achieved in the antenna. Properly selected, with the proper radiating mechanism, radiating position, dielectric constant, and cavity size, as described herein above, beam steering can be achieved.

As will be discussed below in conjunction with FIGS. 5-9, three prototype antenna assemblies/antennas were fabricated and tested and it was found that measurements of each prototype agree very well with each other and including simulation. It was also found that measured data shows significant improvement in gain on the horizon, wide angular coverage, and stable fixed beam steering throughout impedance bandwidth and measured data also shows wide impedance bandwidth, ample for most traditional datalink systems.

Figure 5:
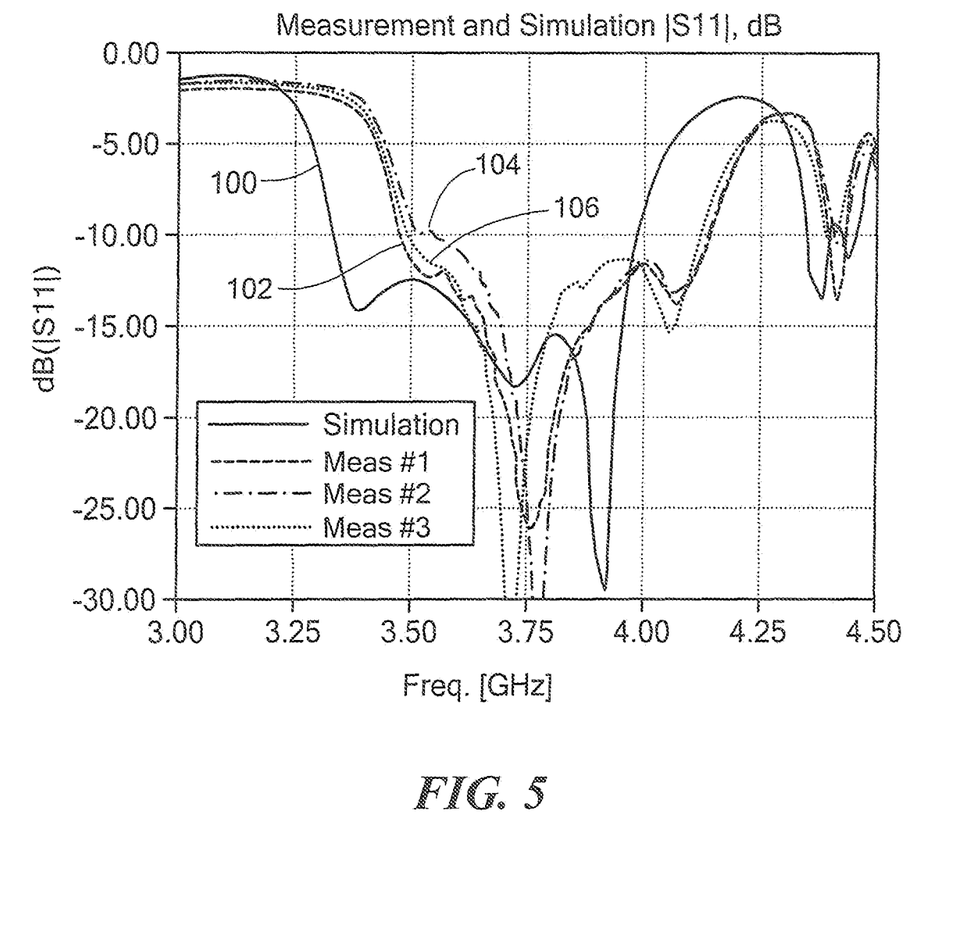
FIG. 5 is a plot of simulated and measured input reflection coefficient vs. frequency of an exemplary beam-steered, wide bandwidth electromagnetic band gap antenna element which may be the same as or similar to that shown in FIGS. 1-3.

Referring now to FIG. 5, a plot of input reflection coefficient (S11) of an exemplary antenna design includes both a simulated response curve 100 and three measured prototype response curves 102, 104, 106 for an antenna design. As shown, the measured results agree well with the simulation. As can be seen from FIG. 5, a wide impedance bandwidth is achieved in the antenna achieving a 2:1 voltage standing wave ratio (VSWR) over the shaded region in FIG. 5. Such an impedance bandwidth is adequate for most modern data link systems.

Figure 6:
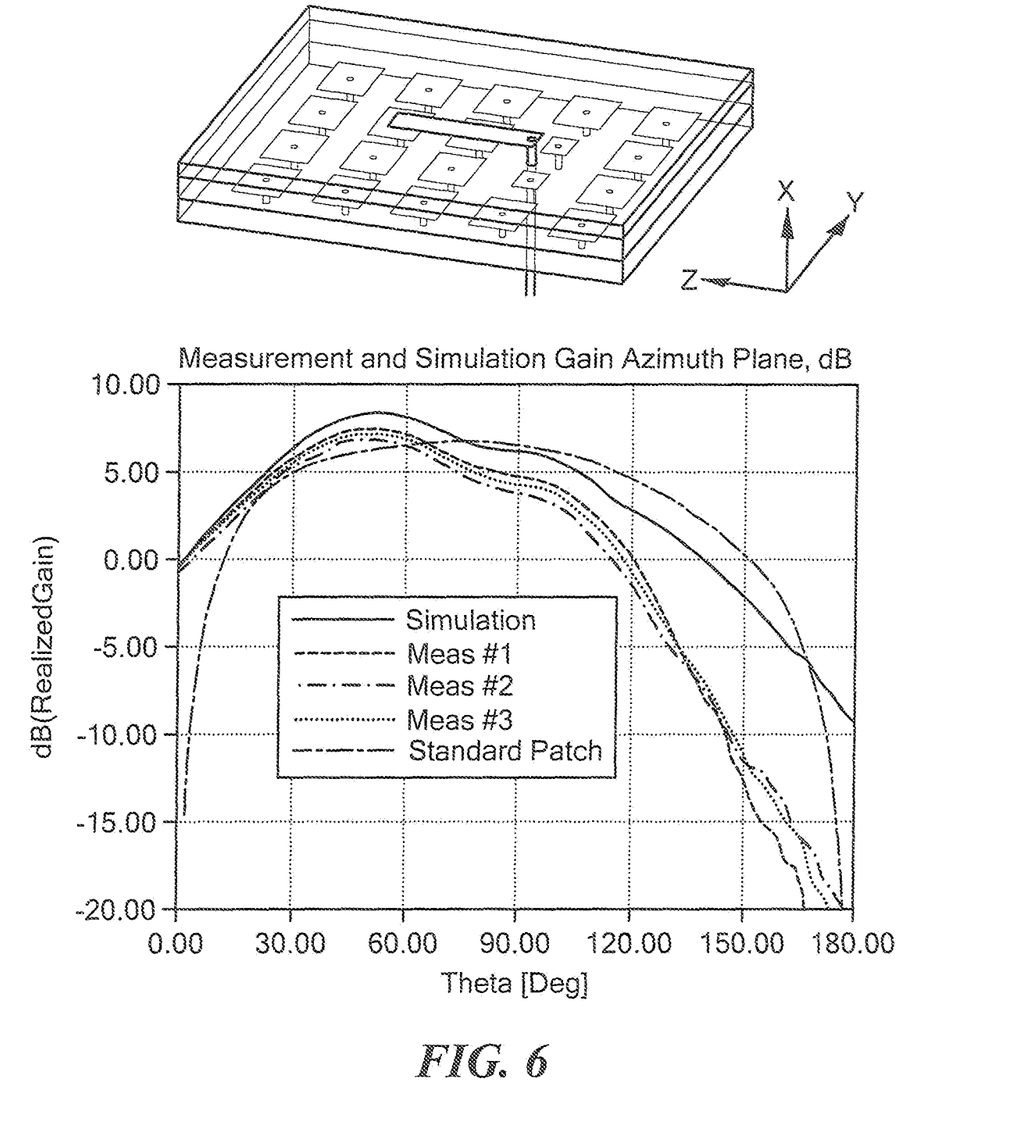
FIG. 6 is a plot of simulated and measured antenna gain vs. angle in an azimuth plane for an exemplary beam-steered, wide bandwidth electromagnetic band gap antenna element which may be the same as or similar to that shown in FIG. 1.

FIG. 6 is a plot of antenna gain versus azimuth angle for an exemplary antenna design. Both simulated and measured results are shown at a frequency of 3.5 GHz. The plot shows that at a frequency of 3.5 GHz, a peak gain of approximately 9 dB was achieved by the design.

Figure 6A:
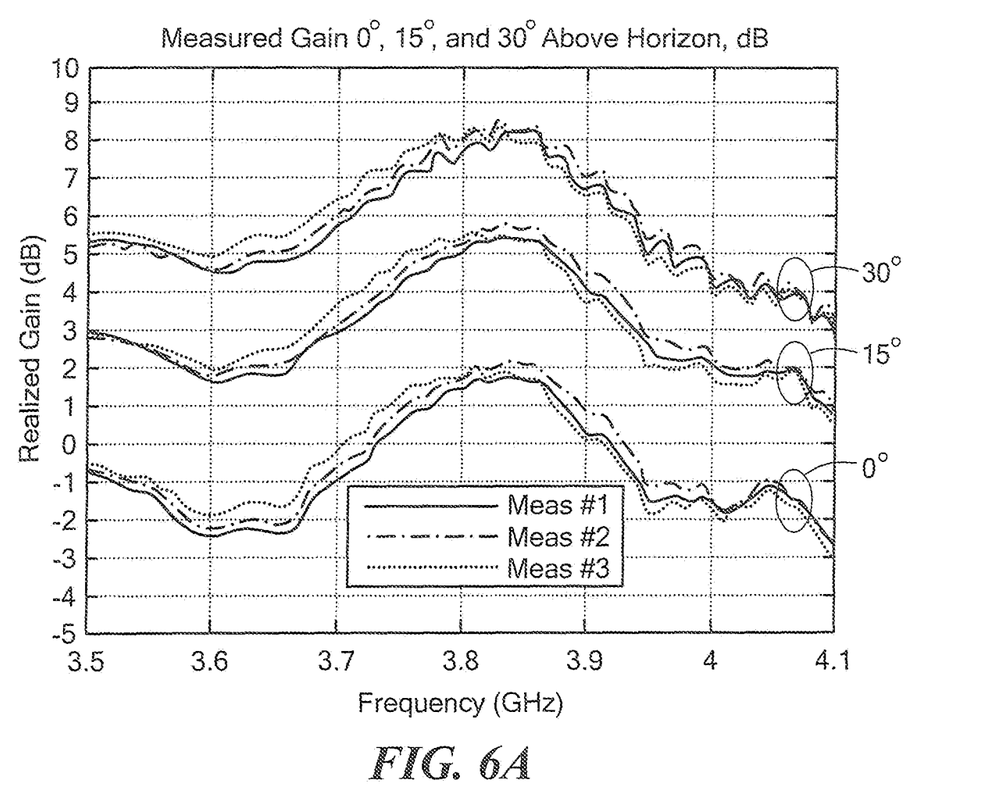
FIG. 6A is a plot of gain versus azimuth angle 0, 15, and 30 degrees above horizon vs. frequency for an exemplary beam-steered, wide bandwidth electromagnetic band gap antenna element which may be the same as or similar to that shown in FIGS. 1-3.
Figure 6B:
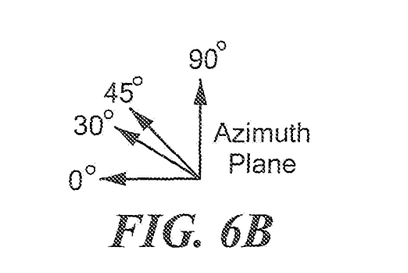
FIG. 6B is a diagram which illustrates azimuth planes along which the measurements of FIG. 6 were taken.

FIGS. 6A, 6B illustrate measured gain in the three different azimuth planes (0 degrees, 15 degrees and 30 degrees) vs. frequency. This plot is significant because this shows the stability of the beam steering vs. frequency, specifically within the VSWR 2:1 bandwidth (3.5-4.1 GHz). At 0 deg, the gain is >−2.5 dB over the VSWR 2:1 frequency bandwidth. This plot shows the beam steering holds up over the increased impedance bandwidth.

In some embodiments, multiple electromagnetic band gap (EBG) antennas assemblies (e.g. antenna assemblies 10, described in FIG. 1) are implemented together as an array antenna.

Figure 7:
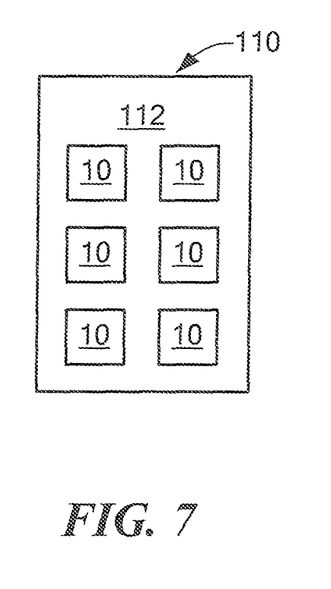
FIG. 7 is a block diagram of an exemplary array antenna provided from a plurality of exemplary beam-steered, wide bandwidth electromagnetic band gap antenna elements.

Referring now to FIG. 7, an exemplary array antenna 110 includes a number of antenna assemblies (e.g., each of which may be the same as or similar to antenna assembly 10 of FIG. 1) mounted (or otherwise installed or disposed) within corresponding cavities of a mounting surface 112. The antenna assemblies may be arranged in any regular lattice pattern (e.g. square, rectangular, hexagonal, elliptical, circular, etc) or even in an irregular lattice pattern depending upon the needs of a particular application.

As described previously, in some embodiments, the mounting surface 112 may be the exterior skin of a vehicle or other mounting platform. The antenna assemblies 10 may be flush mounted within the various cavities to reduce problems related to, for example, wind drag. In some embodiments, however, flush mounting is not used. One or more beamformers may be coupled to the various antenna assemblies for use in forming beams using the various antenna elements. Because each of the elements of the array antenna 110 are housed within cavities, cross talk between the elements will typically be lower than it would be without cavities.

The techniques and structures described herein may be used, in some implementations, to generate conformal antennas or antenna arrays that conform to a curved surface on the exterior of a mounting platform (e.g., a missile, an aircraft, etc.). When used in conformal applications, the structures described above can be re-optimized for a conformal cavity. Techniques for adapting an antenna design for use in a conformal application are well known in the art and typically include re-tuning the antenna parameters for the conformal surface.

The antenna designs and design techniques described herein have application in a wide variety of different applications. For example, the antennas may be used as active or passive antenna elements for missile sensors that require bandwidth, higher gain to support link margin, and wide impedance bandwidth to support higher data-rates, within a small volume. They may also be used as antennas for land-based, sea-based, or satellite communications. Because antennas having small antenna volume are possible, the antennas are well suited for use on small missile airframes. The antennas may also be used in, for example, handheld communication devices (e.g., cell phones, smart phones, etc.), commercial aircraft communication systems, automobile-based communications systems (e.g., personal communications, traffic updates, emergency response communication, collision avoidance systems, etc.), Satellite Digital Audio Radio Service (SDARS) communications, proximity readers and other RFID structures, radar systems, global positioning system (GPS) communications, and/or others. In at least one embodiment, the antenna designs are adapted for use in medical imaging systems. The antenna designs described herein may be used for both transmit and receive operations. Many other applications are also possible.

Having described exemplary embodiments of the invention, it will now become apparent to one of ordinary skill in the art that other embodiments incorporating their concepts may also be used. The embodiments described herein should not be limited to disclosed embodiments but rather should be limited only by the spirit and scope of the appended claims. All publications and references cited herein are expressly incorporated herein by reference in their entirety.

What is claimed is:

1. An antenna comprising:
   a ground plane;
   an electromagnetic band gap (EBG) structure disposed about the ground plane, the EBG structure having a number of unit cells arranged in rows and columns wherein the rows and columns defined two orthogonal axes;
   a radiating element disposed above the EBG structure, the radiating element having a long dimension and a short dimension wherein one of the long and short dimensions is aligned along at least one of the two orthogonal axes defined by the rows and columns of the EBG structure;
   a conductive cavity defined by sidewalls and a bottom surface, the conductive cavity encompassing the EBG structure and the radiating element, and being open on a radiating side of the antenna; and
   wherein the EBG structure is spaced a predetermined distance from the sidewalls of the conductive cavity to provide a predetermined capacitance between the sidewalls of the conductive cavity and the EBG structure, and to provide the antenna having a predetermined bandwidth and beam steering angle.

2. The antenna of claim 1, wherein the antenna is configured for use with linearly polarized waves.

3. The antenna of claim 1, wherein the radiating element is oriented at an angle with respect to the axes defined by the rows and columns of the EBG structure such that the radiating element supports at least one of two orthogonally polarized electric fields.

4. The antenna of claim 3, wherein the angle at which the radiating element is oriented is selected based on the predetermined beam steam angle.

5. The antenna of claim 1, wherein the radiating element includes one of: a patch element, a dipole element, and a monopole element.

6. The antenna of claim 1, further comprising a feed circuit coupled to the radiating element through the ground plane and the EBG structure.

7. The antenna of claim 6, wherein at least two of the plurality of unit cells in the EBG structure have different dimensions than the remaining plurality of unit cells to accommodate the feed circuit through the EBG structure, and wherein a size and shape of the at least two of the plurality of unit cells is selected to provide a tuning structure for the predetermined bandwidth.

8. The antenna of claim 1, wherein the bottom surface of the conductive cavity includes the ground plane of the antenna assembly.

9. The antenna of claim 1, further comprising a radome covering an upper surface of the radiating element.

10. The antenna of claim 9, wherein an upper surface of the radome is substantially flush with an upper edge of the conductive cavity.

11. The antenna of claim 1, wherein an upper surface of the radiating element is substantially flush with an upper edge of the conductive cavity.

12. The antenna of claim 1, wherein:
the conductive cavity is formed within an outer skin of a vehicle; and
an upper surface of the antenna is flush with the outer skin of the vehicle.

13. The antenna of claim 12, wherein the vehicle includes one of: a ground vehicle, a watercraft, an aircraft, and a spacecraft.

14. The antenna of claim 1, wherein: a length, a width, and a height of the conductive cavity are each less than a wavelength at the center frequency of the antenna.

15. The antenna of claim 1, wherein the antenna is conformal to a curved surface of a mounting platform.

16. The antenna of claim 1, wherein:
the radiating element is a first radiating element of a plurality of radiating elements each of the plurality of radiating elements disposed above the EBG structure, and having a long dimension and a short dimension, and an orientation that is orthogonal to an orientation of at least one other one of the plurality of radiating elements, wherein at least some of the radiating elements are disposed on different layers of the antenna.

17. An antenna assembly comprising:
an electromagnetic band gap (EBG) structure having first and second opposing surfaces and a plurality of unit cells disposed there between, with the unit cells arranged in rows and columns which define two orthogonal axes;
a radiating element disposed over a first one of the first and second opposing surfaces of the EBG structure, the radiating element having a long dimension and a short dimension, the radiating element being held in a fixed position with respect to the EBG structure such that one of the long and short dimensions of the radiating element is aligned with at least one of the orthogonal axes defined by the rows and columns of the EBG structure; and
a feed circuit coupled to the radiating element through the EBG structure, wherein at least two of the plurality of unit cells in the EBG structure have smaller dimensions than the remaining plurality of unit cells to accommodate the feed circuit through the EBG structure.

18. The antenna assembly of claim 17, further comprising:
a ground plane disposed over a second one of the first and second opposing surfaces of the EBG structure.

19. The antenna assembly of claim 17 wherein the antenna assembly is configured for insertion into a conductive cavity having dimensions that are selected to form an antenna having radiation performance that is characteristic of a larger antenna.

20. The antenna assembly of claim 19, wherein the EBG structure is spaced a predetermined distance from sidewalls of the conductive cavity to provide a capacitance value between the sidewalls of the conductive cavity and the EBG structure, and wherein the predetermined distance is selected to provide the antenna having a predetermined bandwidth and beam steering angle.

21. The antenna assembly of claim 17, wherein the radiating element is one of: a patch element, a dipole element and a monopole element.

22. The antenna assembly of claim 17, wherein:
the antenna assembly is configured for insertion into a conductive cavity within an outer skin of a vehicle; and
the antenna assembly has a height that allows the antenna assembly to be mounted in the conductive cavity substantially flush to the outer skin of the vehicle.

23. A method for designing an antenna having at least one radiating element disposed above an electromagnetic band gap (EBG) structure within a conductive cavity, the at least one radiating element being aligned with respect to the EBG structure, the method comprising:
determining an approximate size of the conductive cavity;
selecting a dielectric material and a number and arrangement of unit cells to use in the EBG structure that will fit within the approximate size of the conductive cavity;
selecting a radiating element;
designing a unit cell of the EBG structure that will result in the antenna assembly having desired antenna response characteristics, wherein designing a unit cell takes into consideration performance effects of the conductive cavity on the operation of the EBG structure; and
adjusting a size of at least the conductive cavity to space the EBG structure a predetermined distance from sidewalls of the conductive cavity to provide a predetermined capacitance between the sidewalls of the conductive cavity and the EBG structure, and to provide the antenna having a predetermined bandwidth and beam steering angle.

* * * * *